(12) United States Patent
Sakuma et al.

(10) Patent No.: US 6,268,754 B1
(45) Date of Patent: Jul. 31, 2001

(54) GATE DRIVING CIRCUIT FOR POWER SEMICONDUCTOR SWITCH

(75) Inventors: Takeshi Sakuma; Katsuji Iida, both of Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/615,301

(22) Filed: Jul. 13, 2000

(30) Foreign Application Priority Data

Jul. 15, 1999 (JP) .................................................. 11-201163
Mar. 3, 2000 (JP) ............................................. 2000-058216

(51) Int. Cl.$^7$ ..................................................... H03H 11/26
(52) U.S. Cl. ........................... 327/283; 327/428; 327/438
(58) Field of Search ..................................... 327/109, 110, 327/268, 283, 290, 428, 376, 377, 427, 429, 430, 434, 435, 438, 440, 442, 450, 452, 453, 455, 469

(56) References Cited

U.S. PATENT DOCUMENTS

| 4,136,382 | * | 1/1979 | Ricci ..................... | 363/137 |
| 4,297,594 | | 10/1981 | Onda et al. ........................ | 327/442 |
| 5,734,258 | * | 3/1998 | Esser ..................... | 323/224 |
| 5,742,146 | * | 4/1998 | Langhorst ........................ | 318/701 |
| 5,969,964 | * | 10/1999 | Mangtani .............. | 363/132 |

FOREIGN PATENT DOCUMENTS 87 18 008.1   2/1993 (DE) .
60-22464      2/1985 (JP) .
2-206358      8/1990 (JP) .
9-037543      7/1997 (JP) .

* cited by examiner

Primary Examiner—Tuan T. Lam
Assistant Examiner—Hiep Nguyen
(74) Attorney, Agent, or Firm—Burr & Brown

(57) ABSTRACT

A gate driving circuit for power semiconductor switch including a DC voltage source whose positive output terminal is connected to a cathode of a power semiconductor switch, a series circuit of a reactor and a turn-on switching element connected across the positive output terminal of the DC voltage source and a gate of the power semiconductor switch, a turn-off switching element connected across the gate of the power semiconductor switch and a negative output terminal of the DC voltage source, a freewheel diode connected across the negative output terminal of the DC voltage source and a junction point between the turn-on switching element and the reactor, and a control circuit for controlling the turn-on and turn-off switching elements such that the power semiconductor switch is kept non-conductive by making the first and second switching elements in off-state and in on-state, respectively, upon turning-on the power semiconductor switch, after storing energy in said reactor by changing the first switching element from off-state into on-state, the second switching element is changed into the off-state to discharge the energy stored in the reactor abruptly into the gate of the power semiconductor switch.

10 Claims, 8 Drawing Sheets

GATE DRIVING CIRCUIT FOR POWER SEMICONDUCTOR SWITCH

BACKGROUND OF THE INVENTION

1. Field of the Invention

The present invention relates to a gate driving circuit for a power semiconductor switch, and more particularly to a pulse driving circuit for driving abruptly or steeply a power semiconductor switch into a conductive state at a very high speed.

2. Description of the Related Art

In the power energy field, there has been developed a pulse power technique. In the pulse power technique, energy is first stored at a very slow rate, and then the stored energy is instantaneously discharged within an extremely short time period such as 100 nano-seconds to obtain extremely high power not less than $10^8$ Watts. In order to discharge a large amount of energy as fast as possible, it is required to provide a high speed switching element which can operate at a high voltage. To this end, there have been proposed to utilize gap switch and thyratron. However, these switches could not be operated at a sufficiently high frequency and a life time of these switches is rather short.

Recently there have been developed various kinds of power semiconductor switching elements such as thyristor, static induction thyristor, gate turn-off thyristor (GTO) and insulated-gate bipolar transistor (IGBT), which have a high speed switching property at a rather high voltage and a relatively large current. These power semiconductor switching elements have been practically used. Particularly, a series circuit of these power semiconductor switching elements could be utilized as a high voltage power semiconductor switch for the pulse power application.

In order to drive the above mentioned power semiconductor switch in a pulse mode, the switch has to be turn-on as fast as possible. To this end, upon triggering, a large current raising very sharply must flow into a gate of the power semiconductor switch for an initial short time period of several tens nano-seconds (ns), and then an on-current of about 1 A has to be flown continuously for about 50 micro-seconds ($\mu$s). There have been proposed several gate driving circuits which can drive the power semiconductor switch in the pulse mode just explained above.

FIG. 1 is an example of known gate driving circuits for driving a power semiconductor switch in a pulse mode. A first DC voltage source 1 for turning-on a semiconductor switch and a second DC voltage source 2 for turning-off a semiconductor switch are provided. A series circuit of a resistor 3 and a capacitor 4 is connected across the turn-on DC voltage source 1, and a junction point between the resistor 3 and the capacitor 4 is coupled with a gate G of a power semiconductor switch 6 by means of a turn-on switching element 5. A stray inductance contained in a circuit portion from the DC voltage source to the gate G of the power semiconductor switch 6 is represented as an inductor 7 which is connected between the turn-on switching element 5 and the gate G of the power semiconductor switch 6.

The above mentioned resistor 3 serves not only as a charging resistor for the capacitor 4 but also as a resistor for supplying a current to the gate G of the power semiconductor switch 6 for maintaining the power semiconductor switch in the conducting state. A cathode K of the power semiconductor switch 6 is connected to a negative terminal of the turn-on DC voltage source 1, and a junction point between the turn-on switching element 5 and the inductor 7 is coupled with a negative terminal of the turn-off DC voltage source 2 by means of a turn-off switching element 8. The turn-on and turn-off switching elements 5 and 8 are controlled by a control circuit 9.

Now the operation of the known gate driving circuit illustrated in FIG. 1 will be explained with reference to signal waveforms shown in FIG. 2. When the power semiconductor switch 6 is in the non-conducting state, the turn-on switching element 5 (SW5) is made off and the turn-off switching element 8 (SW8) is made on under the control of the control circuit 9. Therefore, the capacitor 4 is charged by the turn-on DC voltage source 1 by means of the resistor 3 to a voltage $E_1$ which is equal to the output voltage of the turn-on DC voltage source 1.

At a time instant $t_0$, the turn-on switching element 5 is switched from "off" to "on", and then energy stored in the capacitor 4 flows through the turn-on switching element 5 to the gate G of the power semiconductor switch 6, and further flows to the cathode K of the semiconductor switch. A maximum value of the current flowing from the gate G to the cathode K of the power semiconductor switch 6 is denoted as $I_2$ in FIG. 2. Since the large current $I_2$ flows to the gate G of the power semiconductor switch 6, this switch is turned-on and a large current flows through the anode-cathode A-K path by means of main DC voltage supply source not shown. After that, the power semiconductor switch 6 is kept conductive as long as the current flows into the gate G of the power semiconductor switch. At an instant $t_1$, the turn-on switching element 5 is turned-off and the turn-off switching element 8 is turned-on by the control circuit 9, and then the power semiconductor switch 6 is turned-off.

A raising rate ($di_G/dt$) of the gate current $I_G$ flowing into the gate G of the power semiconductor switch 6 when the turn-on switching element 5 is made on, is determined by the voltage $E_1$ of the turn-on DC voltage source 1 and the stray inductance $L_S$ denoted by the inductor 7 in FIG. 1. That is to say, the raising rate ($di_G/dt$) can be expressed by $di_G/dt = E_1/L_S$. Usually the stray inductance $L_S$ is about 100 nH and the raising rate ($di_G/dt$) of the gate current is required not less than 3000 A/$\mu$s. Therefore, the voltage $E_1$ of the turn-on DC voltage source 1 has to be not lower than 300 V.

An amount of charge Q to be supplied to the gate G of the power semiconductor switch 6 for turning-on the power semiconductor switch at a high speed is determined by respective switches. This amount of charge Q is identical with an amount of charge stored in the capacitor 4, and its energy is represented by $\frac{1}{2} \times QE_1$. An energy loss in the resistor 3 for storing such energy is also expressed by $\frac{1}{2} \times QE_1$. Therefore, the turn-on DC voltage source 1 has to supply a sum of these energy and is equal to $QE_1$.

Now it is assumed that the capacitor 4 has a capacitance of 0.5 $\mu$F and a pulse repetition frequency is 2 KHz. Then the turn-on DC voltage source 1 must supply a power of 90 W. Since the turn-on DC voltage source 1 must supply the current for keeping the power semiconductor switch 6 conductive for 50 $\mu$s, and this current amounts to a power of 30 W. Therefore, the turn-on voltage source 1 must supply a sum of these powers which amounts to a very large value of 120 W.

SUMMARY OF THE INVENTION

The present invention has for its object to provide a novel and useful gate driving circuit for a power semiconductor switch, in which the above mentioned drawbacks of the known gate driving circuits and the semiconductor switch can be driven in the pulse mode by flowing abruptly a large current to a gate of the power semiconductor switch.

According to the invention, a gate driving circuit for driving a power semiconductor switch in a pulse mode comprises:
- a DC voltage source having first and second output terminals, said first output terminal being connected to a main electrode of a power semiconductor switch;
- a series circuit of a reactor and a first switching element, said series circuit being connected across the main electrode and a gate of the power semiconductor switch;
- a second switching element connected across the gate of the power semiconductor switch and said second output terminal of the DC voltage source; and
- a control circuit for controlling said first and second switching elements such that said power semiconductor switch is kept in non-conductive by making said first and second switching elements in off-state and in on-state, respectively, upon turning-on the power semiconductor switch, after storing energy in said reactor by changing said first switching element from off-state into the on-state, the energy stored in the reactor is discharged abruptly into the gate of the power semiconductor switch by changing said second switching element from the on-state into the off-state.

In the gate driving circuit for power semiconductor switch according to the invention, said reactor is utilized as an energy storing means, to which a current flows from the DC voltage source having a lower output voltage such that the current increases to a desired value, and a sharply increasing gate current is flown into the gate of the power semiconductor switch by utilizing a high voltage which is induced upon discharging the energy stored in the reactor. Therefore, it is possible to realize the gate driving circuit for power semiconductor switch having a low loss as well as a high performance.

In a preferable embodiment of the gate driving circuit according to the invention, each of said first and second switching elements is formed by a semiconductor switching element, and a current required for keeping the power semiconductor switch in the on-state after turning-on the power semiconductor switch is generated by the energy stored in the reactor by continuously keeping said first switching element in the on-state.

In another preferable embodiment of the gate driving circuit according to the invention, a freewheel diode is connected across a junction point between said first switching element and said reactor and a terminal of said second switching element connected to the second output terminal of the DC voltage source, after turning-on the power semiconductor switch, said first switching element is changed into off-state such that the energy stored in the reactor is returned into the DC voltage source via said freewheel diode, while the gate current is flown into the gate of the power semiconductor switch, and then said first switching element is changed again in the on-state such that the gate current required for keeping the power semiconductor switch in the on-state is produced by the energy still stored in the reactor.

Furthermore, in order to drive repetitively the power semiconductor switch into the conductive state in the pulse mode, when said second switching element is made conductive to turn-on the power semiconductor switch, said first switching element is changed into the off-state to prepare a next turning-on operation.

In the gate driving circuit according to the invention, it is preferable to form said first switching element by a semiconductor switching element and to construct said second switching element by a semiconductor switching element which is broken-down by an inversely induced voltage across said reactor when the second switching element is changed from the turn-on state to the turn-off state. In this case, a freewheel diode may be preferably connected across a junction portion between the first semiconductor switching element and the reactor and the second output terminal of the DC voltage source. Then, when said first semiconductor switching element is turned-off, there is established a current path from the reactor and an excess voltage is not applied to the reactor.

According to further aspect of the invention, a gate driving circuit for power semiconductor switch comprises:
- a DC voltage source having positive and negative output terminals, said positive output terminal being connected to a cathode of a power semiconductor switch;
- a series circuit of a reactor and a turn-on switching element, said series circuit being connected across the positive output terminal of the DC voltage source and a gate of the power semiconductor switch;
- a turn-off switching element connected across the gate of the power semiconductor switch and said negative output terminal of the DC voltage source;
- a freewheel diode whose anode is connected to the negative output terminal of the DC voltage source and whose cathode is connected to a junction point between the turn-on switching element and the reactor; and
- a control circuit for controlling said turn-on and turn-off switching elements such that said power semiconductor switch is kept non-conductive by making said first and second switching elements in off-state and in on-state, respectively, upon turning-on the power semiconductor switch, after storing energy in said reactor by changing said turn-on switching element from the off-state into the on-state, the energy stored in the reactor is discharged abruptly into the gate of the power semiconductor switch by changing said turnoff switching element from the on-state into the off-state.

The inventor of the instant application has proposed, in Japanese Patent Publication No. 7-67271, driving circuit, in which a current required for keeping continuously a power semiconductor switch in on-state is derived by chopping a switching element connected in series with a reactor. However, in this known driving circuit, there must be provided positive side and negative side power supply sources, and the power supply circuit becomes complicated. Further the above Publication does not suggest to utilize the driving circuit for driving the power semiconductor switch in the pulse mode. That is to say, the Publication does not teach the subject matter of the present invention that an abruptly raising current is flown into a gate of a power semiconductor switch on the basis of a fact that upon turning a current flowing through the reactor, a large inverted induced voltage is generated, and this voltage is applied to the stray inductance.

DESCRIPTION OF THE PREFERRED EMBODIMENT

Figure 1:
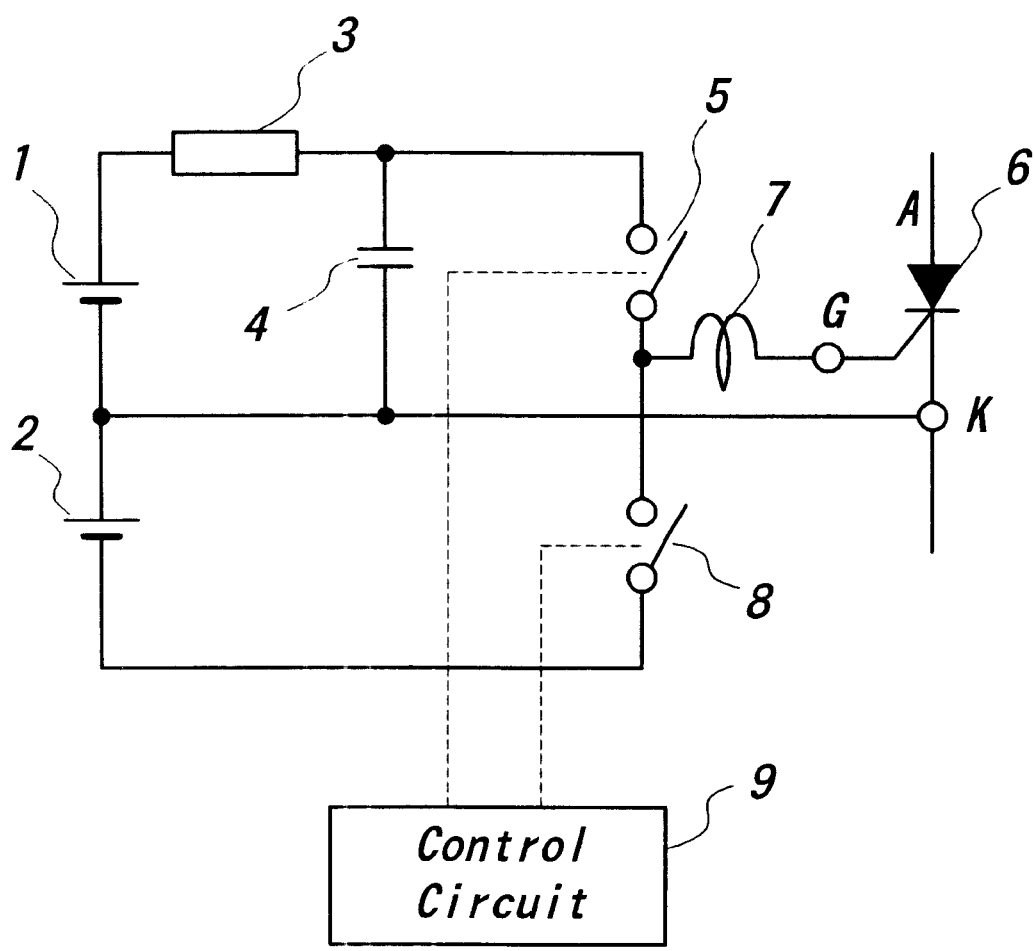
FIG. 1 is a circuit diagram showing a known gate driving circuit for power semiconductor switch.
Figure 2:
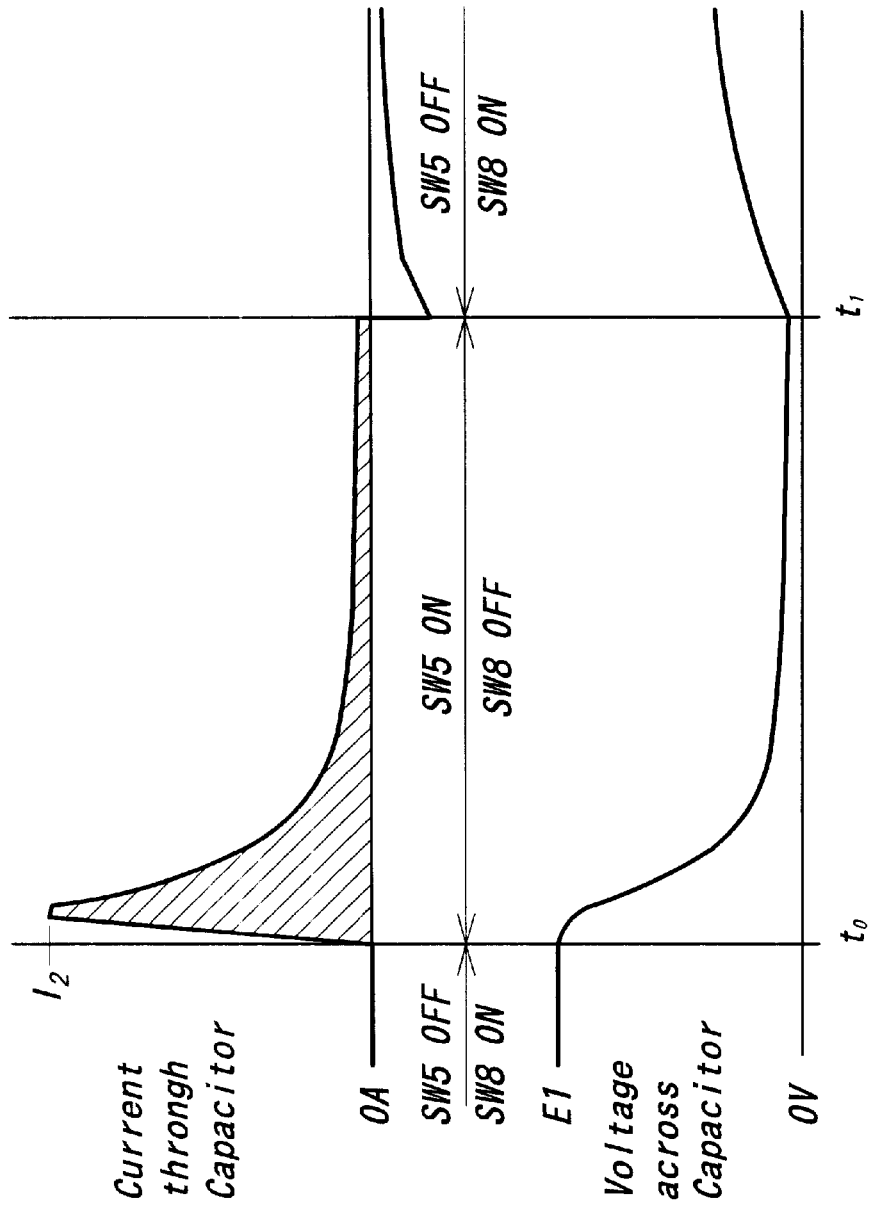
FIG. 2 is a graph representing signal wave forms for explaining the operation of the gate driving circuit shown in FIG. 1.
Figure 3:
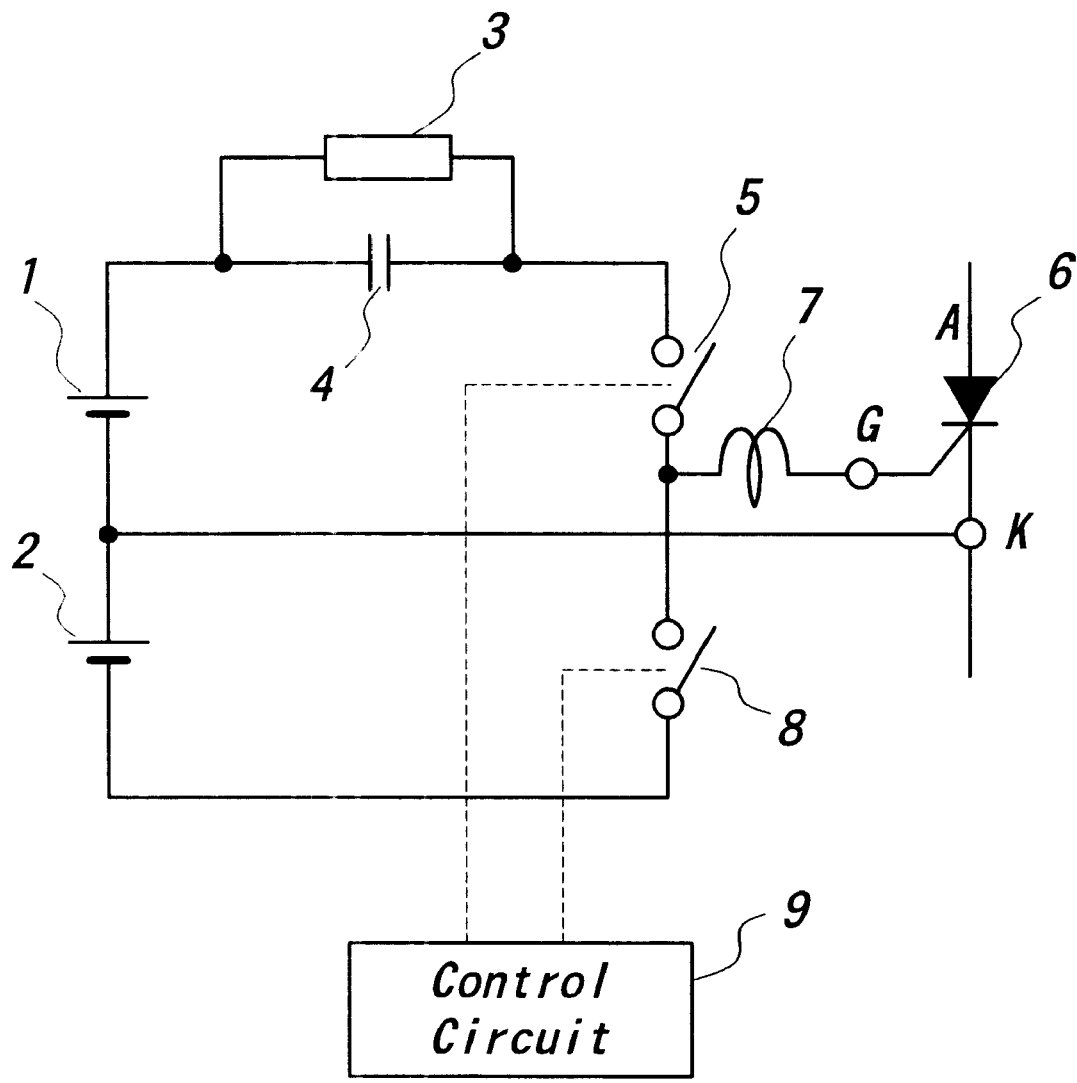
FIG. 3 is a circuit diagram illustrating another known gate driving circuit.

Now the present invention will be explained in detail with reference to several embodiments shown in the drawings.

Figure 4:
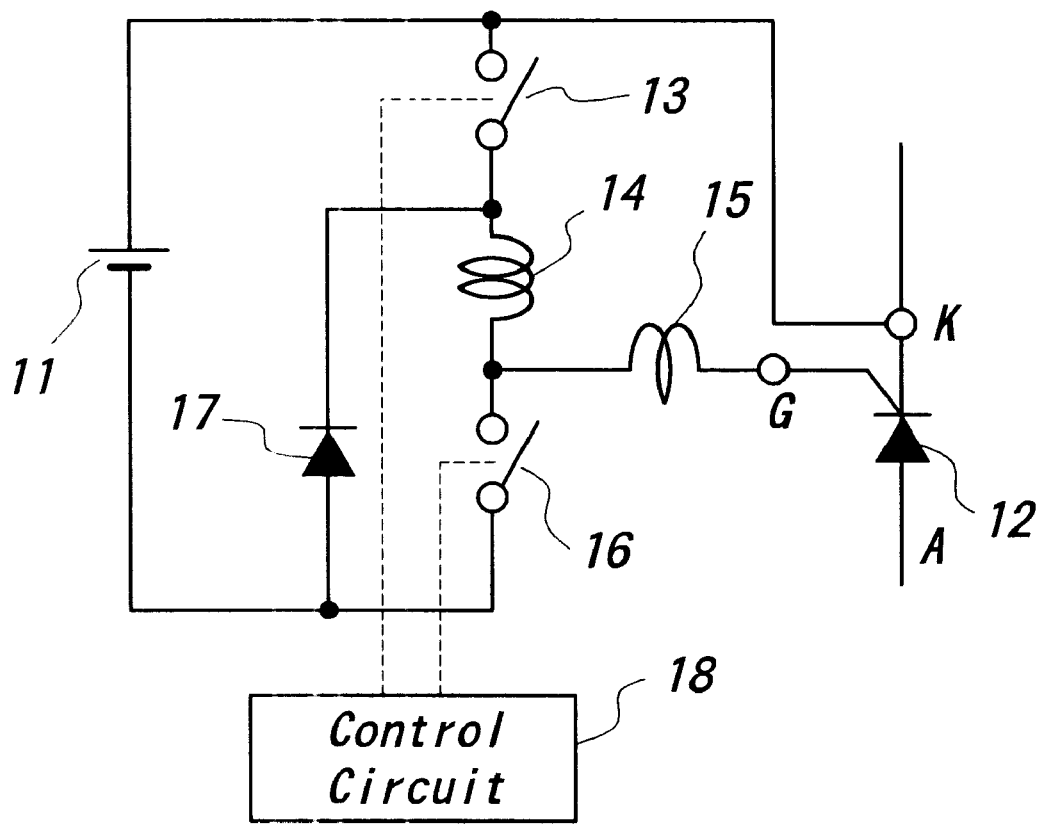
FIG. 4 is a circuit diagram depicting an embodiment of the gate driving circuit for power semiconductor switch according to the invention.

FIG. 4 is a circuit diagram illustrating an embodiment of the gate driving circuit for power semiconductor switch according to the invention. A positive output terminal of a DC voltage source 11 is connected to a cathode K of a power semiconductor switch 12, and a series circuit of a turn-on switching element 13 and a reactor 14 is connected across the positive output terminal of the DC voltage source 11 and a gate G of the power semiconductor switch 12. Between the gate G of the power semiconductor switch 12 and the reactor 14 there is connected an inductance 15 which represents a stray inductance. A junction point between the reactor 14 and the gate G of the power semiconductor switch 12 is connected to a negative output terminal of the DC voltage source 11 by means of a turn-off switching element 16. A freewheel diode 17 is connected across a junction point between the turn-on switching element 13 and the reactor 14 and the negative output terminal of the DC voltage source 11 such that the anode of the freewheel diode 17 is connected to the negative output terminal of the DC voltage source 11. Furthermore, the gate driving circuit comprises a control circuit 18 for controlling on-state and off-state of the turn-on and turn-off switching elements 13 and 16.

Now the operation of the gate driving circuit shown in FIG. 4 will be explained with reference to a graph illustrated in FIG. 5. When the power semiconductor switch 12 is in the off-state, the turn-on switching element 13 (SW13) is in the off-state and the turn-off switching element 16 (SW16) is in the on-state. When the turn-on switching element 13 is changed from the off-state into the on-state at a timing to, a circuit extending from the positive output terminal of the DC voltage source 11 to the negative output terminal thereof by means of the switching element 13, reactor 14 and switching element 16, and a current flowing through the reactor 14 is increased abruptly in a substantially linear manner. Now it is assumed that the output voltage of the DC voltage source 11 is E and the reactor 14 has an inductance L, and then an inclination of the current through the reactor 14 is expressed by E/L.

At an instance $t_1$, the current flowing through the reactor 14 arrives at a desired value $I_1$. and at that time, the turn-off switching element 16 is changed from the on-state to the off-state. Then, the current which has been flowing through the reactor 14 is going to flow into the gate G of the power semiconductor switch 12. However, since the stray inductance is existent between the gate G and the cathode K of the power semiconductor switch 12 as shown by the inductor 15 in FIG. 4, the current flowing through the reactor 14 could not be promptly changed, and therefore a relatively high inversely induced voltage is generated across the reactor 14.

The thus generated inversely induced high voltage across the reactor 14 is applied to the turn-off switching element 16. Usually the switching element is formed by a semiconductor switching element, and the semiconductor switching element has a maximum rated voltage. Therefore, if the above mentioned inversely induced voltage is higher than the maximum rated voltage of the semiconductor switching element, the semiconductor switching element might be destroyed. In a preferable embodiment of the gate driving circuit according to the invention, the turn-off switching element 16 is constructed by a semiconductor switching element such that it is broken down at its maximum rated voltage to absorb a part of the energy induced by the reactor 14. Such a semiconductor device may be "HEXFET" sold by International Rectifier Corporation.

When the semiconductor switching element 16 has a breakdown voltage of $V_B$, the inversely induced voltage by the reactor 14 is suppressed to ($V_B$–E). This voltage of ($V_B$–E) is also applied to the inductor 15 representing the stray inductance $L_S$, and therefore the current flowing through the inductor 15 increases very abruptly at a large rate or a steep inclination of ($V_B$–E)/$L_S$. At an instance $t_2$ at which the current flowing through the inductor 15 becomes equal to the gate current, the breakdown of the turn-off switching element 16 is stopped and no current flows through this switching element. Therefore, only the gate current for the power semiconductor switch 12 flows from the reactor 14.

Now it is assumed that the stray inductance $L_s$ denoted by the inductor 15 is 100 nH, the increasing rate d$i_G$/dt of the gate current $i_G$ is 3000 A/μs and the voltage E of the DC voltage source 11 is 30V, the breakdown voltage $V_B$ of the turn-off semiconductor switching device 16 may be set to 330 V. When a decreasing amount of current of the reactor 14 is assumed to about 40 A, an inductance L of the reactor 14 may be calculated as follows:

$$(V_B-E) \times 50 \text{ nsec}/40 \text{ A} = 375 \text{ nH} \tag{1}$$

Therefore, a required current $I_1$ of the reactor 14 at the instance $t_1$ amounts to 190 A. Then, electromagnetic energy stored in the reactor 14 becomes ½×L×$I_1^2$, and this energy is supplied from the DC voltage source 11. When a pulse repetition frequency is set to 2 KHz like as the previously explained known gate driving circuit, a required power W may be expressed in the following manner:

$$W = \tfrac{1}{2} \times 375 \text{ nH} \times 190^2 \text{ 2 KHz} = 13.5 \text{ W} \tag{2}$$

It is apparent that this power W is smaller than the required power in the known gate driving circuit by about nine times.

At the instance $t_2$, a current for holding the power semiconductor switch 12 in the on-state is flown from the reactor 14 through the gate G of the power semiconductor switch 12, the cathode K of this switch and the turn-on switching element 13 due to the residual energy (=½×L×$I_2^2$) stored in the reactor 14. This current is gradually decreased by a loss in the circuit, but a larger amount of charges can be supplied to the gate G of the power semiconductor switch 12 as a continuous-on-current than the known gate driving circuit. In this manner, according to the invention, after turning-on the power semiconductor switch 12, the energy required for keeping the power semiconductor switch in the conduction state is obtained not from the DC voltage source 11, but from the residual energy remained in the reactor 14. This is a remarkable difference of the present invention from the prior art.

At an instant $t_5$, the turn-on switching element 13 is changed from the on-state into the off-state and the turn-off switching element 16 is changed from the off-state into the on-state by means of the control circuit 18. Then, the cathode K of the power semiconductor switch 12 is connected to the positive output terminal of the DC voltage source 11 and the gate G is connected to the negative output terminal. In this manner, the gate-cathode of the power semiconductor switch 12 is reverse-biased and is turned-off positively.

Figure 5:
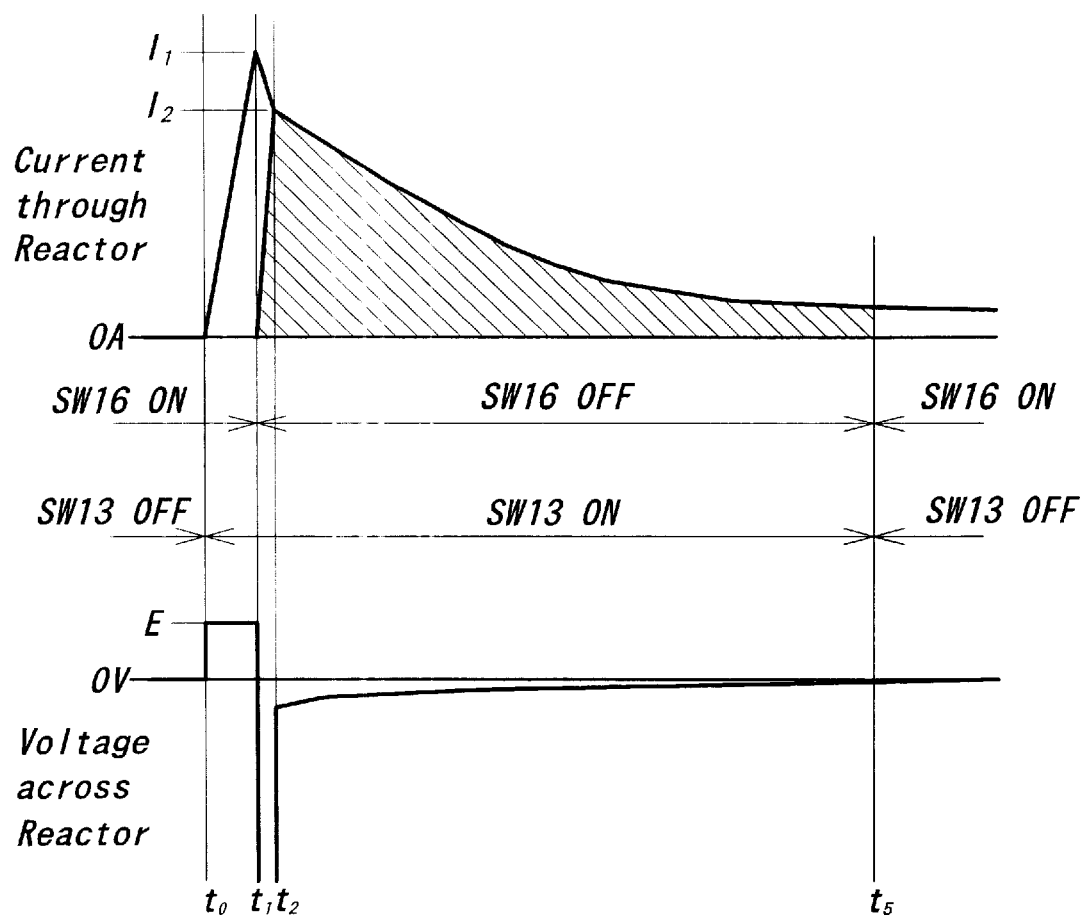
FIG. 5 is a graph showing signal waveforms for explaining the operation of the gate driving circuit shown in FIG. 4.

In the above explained embodiment, as shown in FIG. 5, the turn-on switching element 13 is changed from the off-state into the on-state at the instant $t_0$, and is driven from the on-state into the off-state at the instant $t_5$. The turn-off switching element 16 is changed from the on-state into the off-state at the instant $t_0$, and is driven from the off-state into the on-state at the instant $t_5$. Therefore, after the power semiconductor switch 12 has been made on, the magnetic energy in the reactor 14 circulates through the gate-cathode of the power semiconductor switch and the turn-on switching element 13, and an excessive large current flows into the gate of the power semiconductor switch 12. Such an unnecessarily large gate current introduces a circuit loss and an operating efficiency of the whole gate driving circuit might be decreased.

Figure 6:
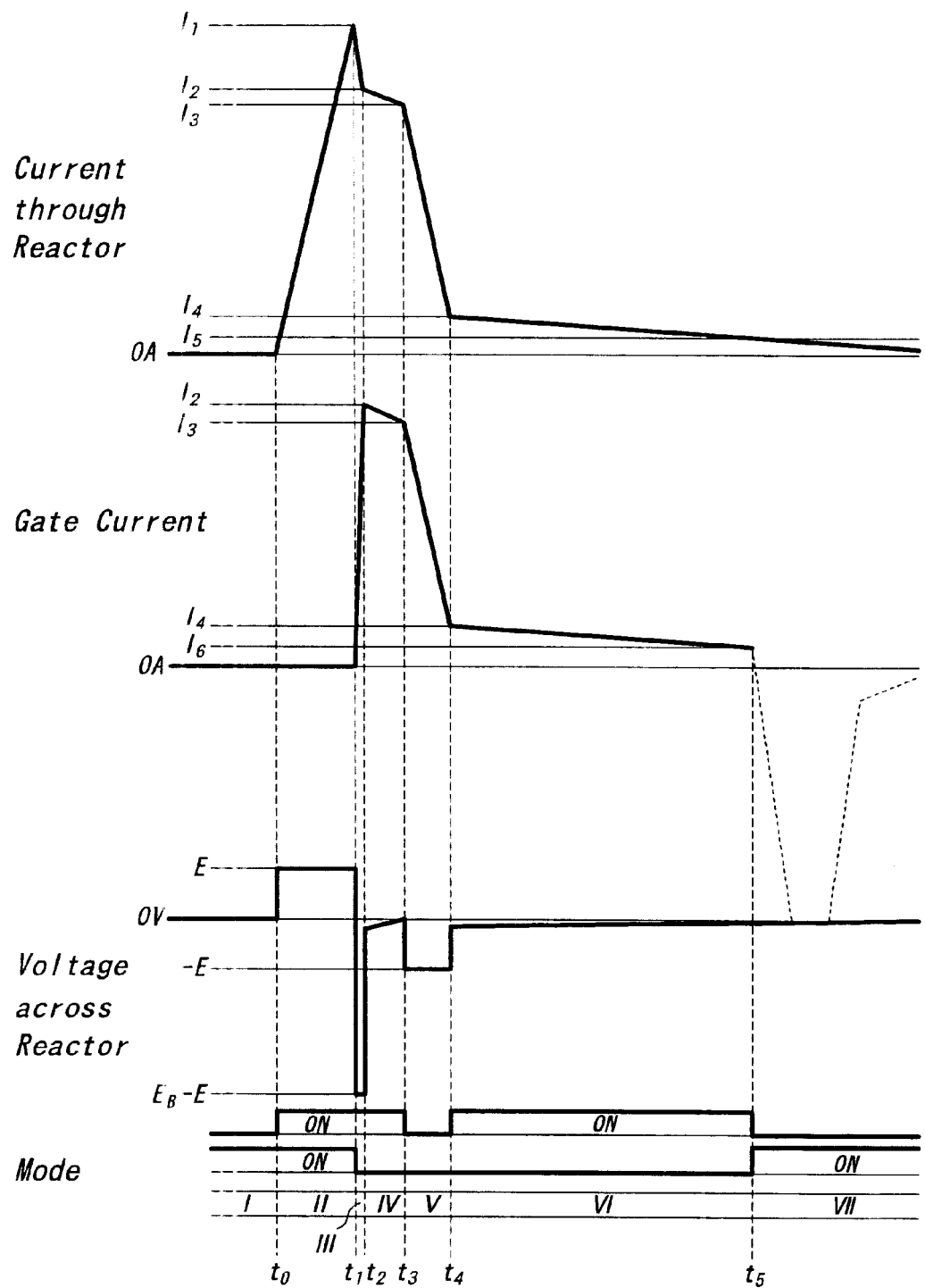
FIG. 6 is a graph showing an operation of another embodiment of the gate driving circuit for power semiconductor switch according to the invention.

FIG. 6 is a graph showing an operation of another embodiment of the gate driving circuit for power semiconductor switch according to the invention. The structure of the gate driving circuit of the present embodiment is identical with that shown in FIG. 4, but the manner of driving the turn-on switching element 13 by the control circuit 18 differs from that of the previous embodiment. Now the operation will be explained in greater detail than the previous embodiment.

In a mode I, the power semiconductor switch 12 is in the off-state, and the turn-on switching element 13 is in the off-state and the turn-off switching element 16 is in the on-state. Since the voltage E of the DC voltage source 11 is applied across the gate G and the cathode K of the power semiconductor switch 12 in a reverse polarity, and therefore the power semiconductor switch is positively kept in the off-state. It should be noted that in this mode I, the current flowing through the reactor 14 is zero.

A mode II is a preparing period for turning-on the power semiconductor switch 12. During this mode II, the turn-on switching element 13 is made conductive by the control circuit 18 and the voltage E of the DC voltage source 11 is applied to the reactor 14 and the current flowing through the reactor 14 is increased to $I_1$.

In a next mode III, the turn-off switching element 16 is driven into the on-state by the control circuit 18 at the instant $t_1$. The current flowing through the reactor 14 tends to flow into the gate G of the power semiconductor switch 12. However, the current could not flow immediately due to the stray inductance of a circuit portion connected to the gate G of the power semiconductor switch 12, and therefore an excessively large reverse voltage produced across the reactor 14. As explained above, the higher the reverse voltage is, the steeper the increasing inclination of the gate current di/dt becomes. However, this reverse voltage is also applied to the turn-off switching element 16 and if the reverse voltage exceeds the rated voltage of the turn-off switching element 16, this switching element is broken. This problem of the breakdown of the turn-off switching element can be resolved by constructing the turn-off switching element 16 by a power MOSFET which is broken down at a predetermined breakdown voltage, can absorb the surge current and has a low on-resistance. Such a power MOSFET is manufactured and sold by International Rectifier Corporation.

Now it is assumed that the turn-off switching element 16 has a breakdown voltage $E_b$, the reactor 14 is clamped at a voltage of $(E_b-E)$. This voltage is also applied to the stray inductance 15 surrounding the gate G of the power semiconductor switch 12, and therefore the gate current increases abruptly. When the gate current becomes identical with the current passing through the reactor 14, the clamped state is released to complete this mode III. This time period is a gate current raising period, and therefore if it is required to flow the gate current with the raising inclination di/dt substantially identical with the known gate driving circuit, the voltage $(E_b-E)$ has to be set to 300 V. Since the period of the mode III is very short such as 50 ns, the energy used in this mode is not so high, although an instantaneous power is very large. At the end of the mode III, the current flowing through the reactor 14 has been decreased to $I_2$.

A next mode IV is a first circulating period. In order to make the gate current not to descend abruptly after the clamp period has been completed, the turn-on switching element 13 is kept in the on-state for a very short time after the turn-off switching element 16 is changed into the off-state at the instant $t_1$. During this mode IV, the current circulates from the reactor 14 through the gate G—cathode K of the power semiconductor switch 12—turn-on switching element 13. It should be noted that according to the invention, it is not always necessary to provide such a circulating period. At the end of the first circulating period, the gate current has been reduced to $I_3$.

A next mode V is a specific to the present embodiment. If the above explained first circulating mode IV is continued as it is, an excessive amount of charge is injected into the gate of the power semiconductor switch 12 and the energy stored in the reactor 14 is wasted. In the present embodiment, after a necessary amount of charge has been injected for the gate-turn-on of the power semiconductor switch 12, the gate current is abruptly deceased to a level necessary for keeping continuously the power semiconductor switch 12 in the on-state. To this end, at an instant $t_3$, the turn-on switching element 13 is changed into the off-state. Then, the current so far flowing through turn-on switching element 13 is switched to flow through the freewheel diode 17. When the turn-on switching element 13 is made off, the current circulates from the reactor 14 through the gate G—cathode K of the power semiconductor switch 12—DC voltage source 11—freewheel diode 17. In this manner, the energy stored in the reactor 14 is returned into the DC voltage source 11. At the end of the recovery period V, the current flowing through the reactor 14 is reduced to $I_4$.

A next mode V1 is a second circulating period. At an instant $t_4$, the turn-on switching element 13 is made on, and therefore the gate current required for keeping the power semiconductor switch 12 in the turn-on state continuously, i.e. the continuous-on-current $I_{4-5}$ of about 1 A flows for a necessary time period such as about 50 μs. It is desired to make a decreasing rate of the gate current as small as possible.

A last mode VII is a turn-off period. At an instant $t_5$, the turn-on switching element 13 is changed into the off-state and the turn-off switching element 16 is made on under the control of the control circuit 18 to turn-off the power semiconductor switch 12, and after that the power semiconductor switch is remained in the off-state. It should be noted that when the turn-off switching element 16 is changed into the on-state, the voltage E of the DC voltage source 11 is applied across the gate and the cathode of the power semiconductor switch 12 with a reverse polarity. Then, a gate drawing current flows from the cathode to the gate of the power semiconductor switch 12, and therefore the power semiconductor switch is positively turned-off. In the application of the pulse power circuit, since an anode current is zero at that time, the gate drawing current flows only slightly.

In the present embodiment, the turn-on switching element 13 and turn-off switching element 16 are changed into the off-state and on-state, respectively at the same time, but according to the invention, these switching elements may be driven at slightly different timings. That is to say, even if both the switching elements 13 and 16 are in the on-state for a short time period, a large short-circuit current does not flow, because the reactor 14 is connected in series with these switching elements. When the turn-off switching element 16 is made on, a closed circuit of reactor 14—switching element 16—freewheel diode 17—reactor 14 is established, and an initial current $I_5$ circulates through this circuit. Then, a residual energy in the reactor 14 is wasted as the circuit loss. Therefore, if a value of the initial current $I_5$ is determined, it is advantageous to set the inductance of the reactor 14 as small as possible.

Figure 7:
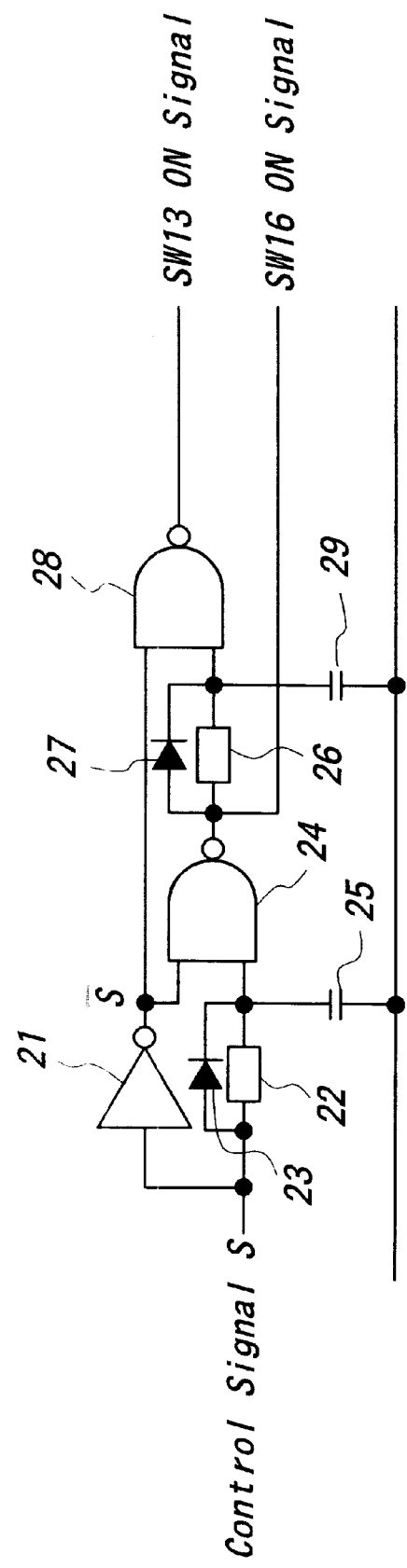
FIG. 7 is a circuit diagram depicting an embodiment of a control circuit of the gate driving circuit according to the invention.
Figure 8:
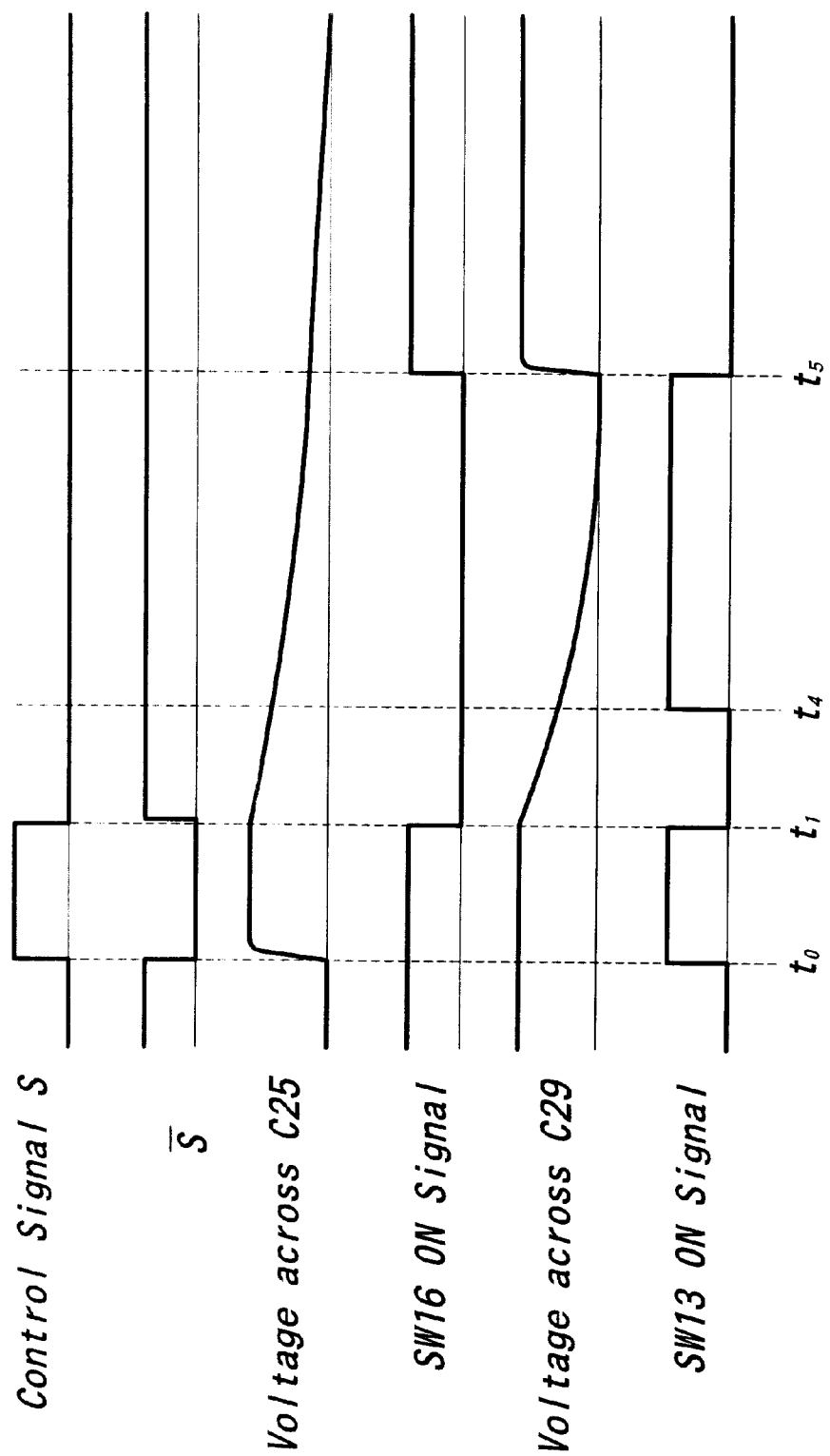
FIG. 8 is a graph representing an operation of the control circuit shown in FIG. 7.

FIG. 7 is a circuit diagram showing an embodiment of the control circuit 18, and FIG. 8 depicts signal waveforms for explaining the operation of the control circuit. In the present embodiment, the driving signals for the turn-on and turn-off switching elements 13 and 16 are generated on the basis of a control signal S shown in FIG. 8. As shown in FIG. 7, the control signal S is supplied to an inverter 21 to produce an inverted control signal $\overline{S}$. At the same time, the control signal S is applied to one input terminal of NAND circuit 24 by means of a parallel circuit of a resistor 22 and a diode 23. The inverted control signal $\overline{S}$ is applied to the other input terminal of the NAND circuit 24. The one input terminal of the NAND circuit 24 is connected to a capacitor 25 which determines a discharge time constant together with the resistor 22. An output terminal of the NAND circuit 24 is connected to one input terminal of NAND circuit 28 via a parallel circuit of a resistor 26 and a diode 27, and the inverted control signal $\overline{S}$ is applied to the other input terminal of the NAND circuit 28. The one input terminal of the NAND circuit 28 is connected to a capacitor 29 which determines a discharge time constant together with the resistor 26. The driving signal for the turn-off switching element 16 is derived from the NAND circuit 24, and the driving signal for the turn-on switching element 13 is produced by the NAND circuit 28.

Now the operation of the control circuit 18 will be explained with reference to the signal waveforms shown in FIG. 8. At the instant $t_0$, the control signal S raises from "0" to "1", and its inverted signal $\overline{S}$ is changed from "1" to "0". Then, the output of the NAND circuit 24 are kept "1" and the output of the NAND circuit 28 is changed from "0" to "1" in regardless with voltages at the capacitors 25 and 29. Therefore, during a time period from the instant $t_0$ to the instant $t_1$ at which the inverted control signal $\overline{S}$ is "1" again, both the turn-on switching element 13 and turn-off switching element 16 are kept in the on-state.

When the control signal S is changed from "1" to "0" at the instant $t_1$, its inverted signal $\overline{S}$ raises from "0" to "1". The capacitor 25 which has been charged at a high speed at the instant $t_0$ is discharged through the resistor 22, and the input to the lower input terminal of the NAND circuit 24 is assumed to be "1" until the instant $t_4$ at which the voltage across the capacitor 25 becomes identical with a threshold level. Therefore, the output signal of the NAND circuit 24 is changed to "0", and the turn-off switching element 16 is made off. Then, the capacitor 29 which has been charged until the instant $t_1$ is discharged through the resistor 26, and the input voltage to the lower input terminal of the NAND circuit 28 is considered to be high "1" until the voltage across the capacitor 29 is reduced to a threshold level. Therefore, the output signal of the NAND circuit 28 is changed into "0" and the turn-on switching element 13 is made off.

When the voltage across the capacitor 29 arrived at the threshold level at the instant $t_4$, the output signal of the NAND circuit 28 is changed into "1", and the ON-signal for the turn-on switching element 13 becomes "1". After that, the voltage across the capacitor 25 arrives at the threshold level at the instant $t_5$, and the output signal of the NAND circuit 24 is changed into "1" to change the ON-signal for the turn-off switching element 16 into "1". At the same time, since the capacitor 29 is charged at a high speed by means of the diode 27, the output signal of the NAND circuit 28 is changed into "0" and the ON-signal for the turn-on switching element 13 is changed from "1" into "0".

As explained above, in the control circuit of the present embodiment, by using the control signal S whose raising and descending edges define the start timing $t_0$ and $t_1$ of the modes II and III, respectively, the start timings of the succeeding modes IV–VII can be determined by suitably setting time constants of the resistors and capacitors of the control circuit.

It should be noted that the present invention is not limited to the embodiments explained above, but various alternations and modifications may be conceived by those skilled in the art within the scope of the invention. For instance, in the above embodiments, the power semiconductor switch is formed by the gate turn off thyristor (GTO), but it may be constructed any other power semiconductor switches such as IGBT, thyristor, SI thyristor and bipolar transistor.

Moreover, in the above embodiments, turn-on and turn-off switching elements are preferably formed by semiconductor switching elements, and particularly they may advantageously constructed by bipolar transistor and MOSFET. Furthermore, the freewheel diode may be replaced by a semiconductor switching element.

As explained above, in the gate driving circuit for power semiconductor switch according to the invention, it is possible to supply the abruptly increasing gate current with a small power by a simple circuit. Particularly, in the second embodiment, there is provided the current recovery period in which the current flowing through the reactor is changed to flow into the DC voltage source through the freewheel diode by making the turn-on switching element off after the current through the reactor reached its peak value. Therefore, the magnetic energy stored in the reactor can be recovered by the DC voltage source and the power consumption can be further reduced.

What is claimed is:

1. A gate driving circuit for power semiconductor switch in a pulse mode comprising:

a DC voltage source having first and second output terminals, said first output terminal being connected to a main electrode of a power semiconductor switch;

a series circuit of a reactor and a first switching element, said series circuit being connected across the main electrode and a gate of the power semiconductor switch;

a second switching element connected across the gate of the power semiconductor switch and said second output terminal of the DC voltage source; and a control circuit for controlling said first and second switching elements such that said power semiconductor switch is kept in non-conductive by making said first and second switching elements in off-state and in on-state, respectively, upon turning-on the power semiconductor switch, after storing energy in said reactor by changing said first switching element from off-state into the on-state, the energy stored in the reactor is discharged abruptly into the gate of the power semiconductor switch by changing said second switching element from the on-state into the off-state.

2. A gate driving circuit for power semiconductor switch according to claim 1, wherein each of said first and second switching elements is formed by a semiconductor switching element.

3. A gate driving circuit for power semiconductor switch according to claim 2, wherein said control circuit is constructed such that a gate current required for keeping the power semiconductor switch conductive after turning-on the power semiconductor switch is generated by the energy stored in the reactor by continuously keeping said first switching element in the on-state.

4. A gate driving circuit for power semiconductor switch according to claim 3, wherein said control circuit is constructed such that said first switching element is changed from the on-state into the off-state to prepare a next turn-on operation of the power semiconductor switch when said power semiconductor switch is turned-off by changing said second switching element from the off-state into the on-state.

5. A gate driving circuit for power semiconductor switch according to claim 2, wherein said second switching element is formed by a semiconductor switching element which is broken-down by an inversely induced voltage across said reactor when said second switching element is changed from the on-state into the off-state.

6. A gate driving circuit for power semiconductor switch comprising:
   a DC voltage source having positive and negative output terminals, said positive output terminal being connected to a cathode of a power semiconductor switch;
   a series circuit of a reactor and a turn-on switching element, said series circuit being connected across the positive output terminal of the DC voltage source and a gate of the power semiconductor switch;
   a turn-off switching element connected across the gate of the power semiconductor switch and said negative output terminal of the DC voltage source;
   a freewheel diode whose anode is connected to the negative output terminal of the DC voltage source and whose cathode is connected to a junction point between the turn-on switching element and the reactor; and
   a control circuit for controlling said turn-on and turn-off switching elements such that said power semiconductor switch is kept non-conductive by making said first and second switching elements in off-state and in on-state, respectively, upon turning-on the power semiconductor switch, after storing energy in said reactor by changing said turn-on switching element from the off-state into the on-state, the energy stored in the reactor is discharged abruptly into the gate of the power semiconductor switch by changing said turn-off switching element from the on-state into the off-state.

7. A gate driving circuit for power semiconductor switch according to claim 6, wherein each of said turn-on and turn-off switching elements is formed by a semiconductor switching element.

8. A gate driving circuit for power semiconductor switch according to claim 7, wherein said control circuit is constructed such that after turning-on said power semiconductor switch, said turn-on switching element is kept in the off-state to flow a gate current to the gate of the power semiconductor switch and at the same time, the energy stored in said reactor is returned into the DC voltage source through the freewheel diode, while the gate current is flown into the gate of the power semiconductor switch, and then said turn-on switching element is changed again into the on-state such that the gate current required for keeping the power semiconductor switch conductive is produced by the energy still stored in the reactor.

9. A gate driving circuit for power semiconductor switch according to claim 8, wherein said turn-off switching element is formed by a semiconductor switching element which is broken-down by an inversely induced voltage across said reactor when said turn-off switching element is changed from the on-state into the off-state.

10. A gate driving circuit for power semiconductor switch according to any one of claim 1, wherein said power semiconductor switch is formed by a switch selected from the group consisting of gate turn off thyristor, insulated gate bipolar transistor, thyristor, static induction thyristor and bipolar transistor.

* * * * *